(12) United States Patent
Sekihara

(10) Patent No.: US 8,293,432 B2
(45) Date of Patent: Oct. 23, 2012

(54) PELLICLE

(75) Inventor: Kazutoshi Sekihara, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 190 days.

(21) Appl. No.: 12/801,642

(22) Filed: Jun. 18, 2010

(65) Prior Publication Data

US 2010/0323281 A1    Dec. 23, 2010

(30) Foreign Application Priority Data

Jun. 19, 2009  (JP) .................. 2009-146196

(51) Int. Cl.
*G03F 1/62* (2012.01)
(52) U.S. Cl. ........................................................... 430/5
(58) Field of Classification Search ......... 430/5; 428/14
See application file for complete search history.

(56) References Cited

U.S. PATENT DOCUMENTS

| 6,436,586 | B1 * | 8/2002 | Matsuoka et al. | 430/5 |
| 2007/0037067 | A1 * | 2/2007 | Wang | 430/5 |
| 2010/0190097 | A1 * | 7/2010 | Nagata | 430/5 |

FOREIGN PATENT DOCUMENTS

| JP | 2000-311616 | 11/2000 |
| JP | 2005-250188 | 9/2005 |

* cited by examiner

*Primary Examiner* — Stephen Rosasco
(74) *Attorney, Agent, or Firm* — Manabu Kanesaka

(57) ABSTRACT

There is provided a pellicle which has a ventilation hole made through at least one frame bar for adjusting the pressure inside the frame to the atmospheric pressure, and a filter to cover up the external opening of the ventilation hole for preventing entrance of a foreign substance, and at least one of two openings of the ventilation hole is chamfered to a degree selected from a group consisting of "C0.5 to C1.0" and "R0.5 to R1.0".

10 Claims, 4 Drawing Sheets

ARROW VIEW ON CENTRAL SECTION though the inside of the ventilation hole is also washed
PELLICLE

FIELD OF THE INVENTION

The present invention relates to a pellicle used as a dust-proof when a semiconductor device, a printed circuit board, a liquid crystal display and the like are manufactured.

BACKGROUND

In manufacture of semiconductor such as LSI and super LSI or in manufacture of a liquid crystal display or the like, a pattern is made by irradiating light to a semiconductor wafer or an original plate for liquid crystal, but if a dust adheres to a photomask or a reticle (hereinafter simply referred to as a photomask in short) used at this time, the dust absorbs light or refracts light, which causes deformation of a transferred pattern, rough edges or black stains on a base and leads to a problem that dimensions, quality, appearance and the like are damaged.

Thus, these works are usually performed in a clean room, but it is still difficult to keep the photomask clean all the time. Therefore, a pellicle is attached to the surface of the photomask as a dustproof and then, exposure is carried out. In this case, foreign substances do not directly adhere to the surface of the photomask but to the pellicle, and by setting a focus on a pattern of the photomask in lithography, the foreign substances on the pellicle no longer become a concern to the transfer.

In general, a transparent pellicle film made of cellulose nitrate, cellulose acetate, fluorine contained resin or the like, which transmits light well, is attached or bonded to an upper end face of a pellicle frame made of aluminum, stainless, polyethylene and the like. Moreover, a pressure-sensitive adhesive layer made of polybutene resin, polyvinyl acetate resin, acrylic resin and the like for attaching to a photomask and a separation layer (separator) for protecting the pressure-sensitive adhesive layer are disposed at a lower end of the pellicle frame.

Also, in a state in which the pellicle is attached to the photomask, with the purpose of eliminating an atmospheric pressure difference between a space surrounded inside the pellicle and the outside, a small hole for adjusting atmospheric pressure is opened in a part of the pellicle frame, and a filter is installed in order to prevent entrance of foreign substances from the air moving through the small hole in some cases (See Japanese Utility Model Registration Application Publication No. 63-39703).

With regard to this filter, a trapping diameter and an area are usually considered so that desired foreign-substance trapping performances and ventilation performances are obtained, and if the desired ventilation performances cannot be obtained with a single filter, a plurality of filters are installed. For example, the number of pellicles used for semiconductor manufacture is often one, but in the case of a large-sized pellicle for liquid crystal manufacture such as those having a side exceeding 500 mm, eight to several tens of filters are usually attached in order to ensure a ventilation amount.

As the filter used here, a sheet-shaped one in which a porous thin film obtained by stretching and working PTFE or the like is used as a ventilation film is suitable for use in the pellicle in general in terms of cost and the shape and often used. The structure is a three-layered structure as shown in FIG. 4, in which a pressure-sensitive adhesive layer 43 to be bonded to a frame is arranged in a ring shape on one face of a filter ventilation film 41, and a rough mesh-state protective mesh 42 made of PP or the like in order to protect the filter ventilation film 41 is bonded to the opposite face, and its entire thickness is approximately 0.15 to 0.3 mm. To this filter, an adhesive of permanent stickiness may be applied or infiltrated, so as to prevent dust generation in some cases (See Japanese Patent Laid-Open No. 09-068792).

In general, the pellicle frame is washed by means such as ultrasonic washing or the like in surfactant or purified water. At that time, the inside of the ventilation hole is also washed by ultrasonic washing in the liquid, but since an ultrasonic wave hardly enters the inside of the ventilation hole, a washing effect is lower than the usual pellicle frame surfaces (other than the hole). Particularly, in the case of a large-sized pellicle with one side exceeding 500 mm, since the frame width is large, the ventilation hole becomes longer with that, and the washing performance is extremely lowered. Moreover, in a foreign substance inspection of the inside of the ventilation hole after the washing, there is disadvantage that the inside of the ventilation hole can rarely be observed visually.

Moreover, the filter is usually mounted to the outer surface of the pellicle frame so as to cover the ventilation hole. Therefore, if a film surface is vibrated by air blow to the filter for example, there is a fear that the film surface is brought into contact with a peripheral edge portion of the ventilation hole and is damaged and generates dusts. The dust generation at this portion might cause a big problem of adhesion of a foreign substance to a mask pattern since it is within an inside area of the pellicle.

SUMMARY OF THE INVENTION

The present invention has an object to provide, in a pellicle in which a ventilation hole for adjusting a pressure of the space within the pellicle frame equal to the atmospheric pressure is made through a pellicle frame bar and a filter for preventing particles from entering the space within the pellicle frame is attached to the external opening of the ventilation hole, a reliable pellicle without a fear of generating dusts from the ventilation hole or the filter during use.

A pellicle according to the present invention comprises:
  a rectangular pellicle frame formed of four side bars, having a ventilation hole made through at least one frame bar for adjusting a pressure inside a space contained within the pellicle frame equal to the environmental pressure; and
  a filter disposed to cover up an external opening of the ventilation hole for preventing entrance of a foreign substance into the space, in which improvement consists in that
  at least one of two openings of the ventilation hole is chamfered to a degree selected from a group consisting of "C0.5 to C1.0" and "R0.5 to R1.0".

The peripheral edge portion of the ventilation hole usually has natural chamfering of approximately C0.1 by sandblast or the like, but by applying chamfering, in addition to lowered dust generation from the peripheral edge portion, dust generation in contact between a filter film and the ventilation hole peripheral edge portion can be prevented.

Also, the pellicle of the present invention is improved in that the ventilation hole is tapered to expand from inside to outside of the frame.

Since the ventilation hole diameter is expanded in a tapered shape, visual observation of the inside of the ventilation hole after washing is facilitated, entrance of an ultrasonic wave into the ventilation hole during the washing is assisted, and the washing effect is improved.

Moreover, in the pellicle, the present invention is characterized in that a surface roughness on the ventilation hole wall face is Ra1 μm or less. As a result, the washing effect is improved, and stray foreign substances become hard to be caught.

Also, in addition to the invention of the ventilation hole, by applying or infiltrating an adhesive substance having permanent stickiness to the ventilation film of the filter, the pellicle without a fear of dust generation during use can be obtained.

According to the present invention, since the peripheral edge portion of the ventilation hole is chamfered and the diameter is expanded in a tapered shape from the inner face side toward the outer face side, dust generation from the peripheral edge portion is drastically decreased, and foreign substance inspections inside the ventilation hole can be performed accurately. Moreover, since the surface roughness of the ventilation hole inner wall is small, washing performances are high, and there is little chance of adhesion of the foreign substances. As a result, an extremely reliable pellicle without a fear of generation of a foreign substance from the ventilation hole or the periphery of the filter during use can be obtained.

DETAILED DESCRIPTION OF THE INVENTION

Embodiments for carrying out the present invention will be described below, but the present invention is not limited to them. Also, the present invention is particularly effective in a large-sized pellicle having a length of one side exceeding 500 mm used in an application of manufacture of a liquid crystal with a wide frame width (=long ventilation hole), for example, but since the desired effect can be also obtained if the present invention is applied to a small-sized pellicle having a narrow frame width (=short ventilation hole) with a length of one side at approximately 150 mm used in an application of a semiconductor, for example, the applications are not particularly limited.

Figure 4:
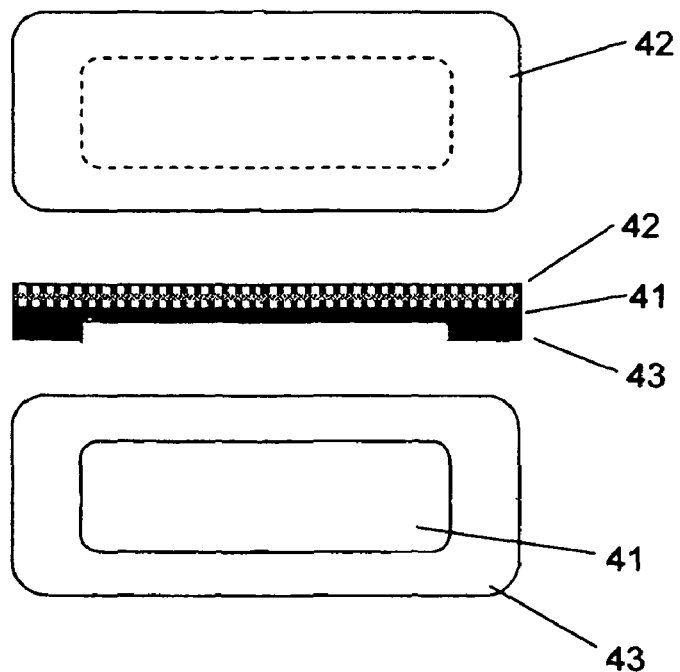
FIG. 4 is a structural outline diagram of a filter.

FIG. 4 shows a structure of a filter used in the present invention. A filter ventilation film 41 is a thin porous film made of PTFE or the like and has a pressure-sensitive adhesive layer 43 to be bonded and fixed to a pellicle frame on its lower face and also a protective mesh 42 for protecting the filter ventilation film on its upper face. Since the pressure-sensitive adhesive layer 43 is in a ring shape, ventilation is performed at the exposed center portion of a filter film 41.

Figure 1:
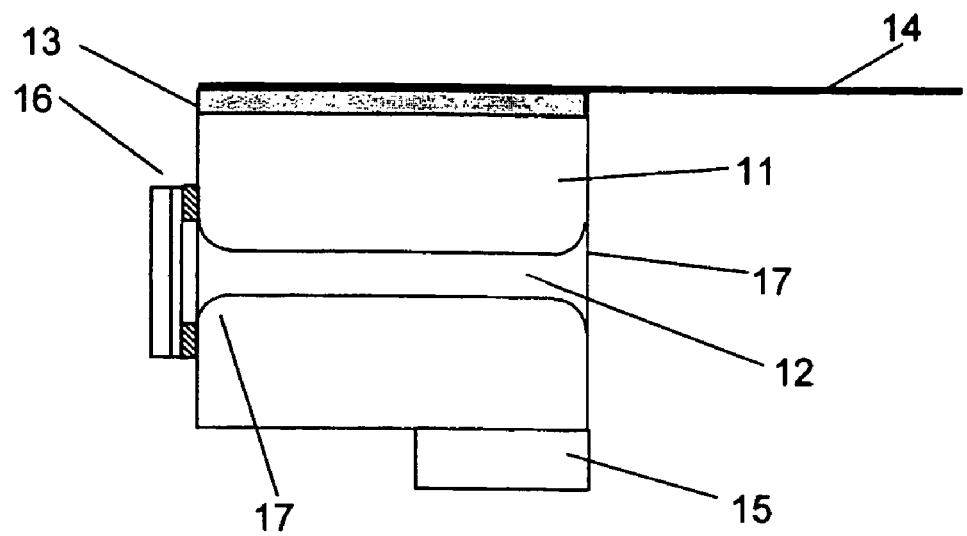
FIG. 1 is a sectional view of the vicinity of a ventilation hole illustrating an example of bell-like opening of both-end peripheral edge portions of the ventilation hole in a pellicle frame, which is an embodiment of the present invention.

FIG. 1 is a sectional view of the vicinity of a ventilation hole illustrating an example in which both-end peripheral edge portions 17 of a ventilation hole 12 of a pellicle frame 11, which is an embodiment of the present invention, are opened bell-like. If bell-like chamfering cannot be made due to a blade used in working, it can be a straight chamfering without curving, but from the viewpoint of prevention of dust generation, bell-like chamfering is more preferable.

As shown in FIG. 1, a pellicle film 14 is stretched over an upper end face of a pellicle frame 11 via a film adhesive layer 13 for affixing the pellicle film 14. A mask pressure-sensitive adhesive layer 15 for attaching to a photomask is usually formed on a lower end face of the pellicle frame 11.

Here, the size of chamfering of the peripheral edge portion 17 (in the case of bell-like chamfering in this figure, it is radius of curvature) is preferably within a range of 0.5 to 1.0 mm. If it is 0.5 mm or less, chamfering is insufficient and the effect is also insufficient, and moreover, the portion becomes too small to be worked, which is a problem. On the other hand, if the size exceeds 1 mm, in addition to a greater influence on frame rigidity, it is excessive and meaningless in terms of washing performance improvement or inspection performance improvement in the ventilation hole, and there are also disadvantages such that a filter 16 to be attached becomes too big or a required tolerance of attachment position becomes strict, which is not preferable.

If the peripheral edge portion 17 at the end portion of the ventilation hole is chamfered, even if strong air blow or the like is applied from the outer face to the filter 16, and the filter 16 is dented and brought into contact with the peripheral edge portion 17 of the ventilation hole, since there is no sharp portion, dust generation by abrasion hardly occurs. Also, since the opening of the peripheral edge portion 17 is bigger, a visual foreign-substance inspection in the ventilation hole 12 after the pellicle frame 11 is washed is facilitated, which is an advantage.

Also, though both the peripheral edge portions 17 outside and inside the pellicle frame 11 are chamfered in a bell-like fashion in this example, only the outside portion may be chamfered from the viewpoint of costs.

Figure 2:
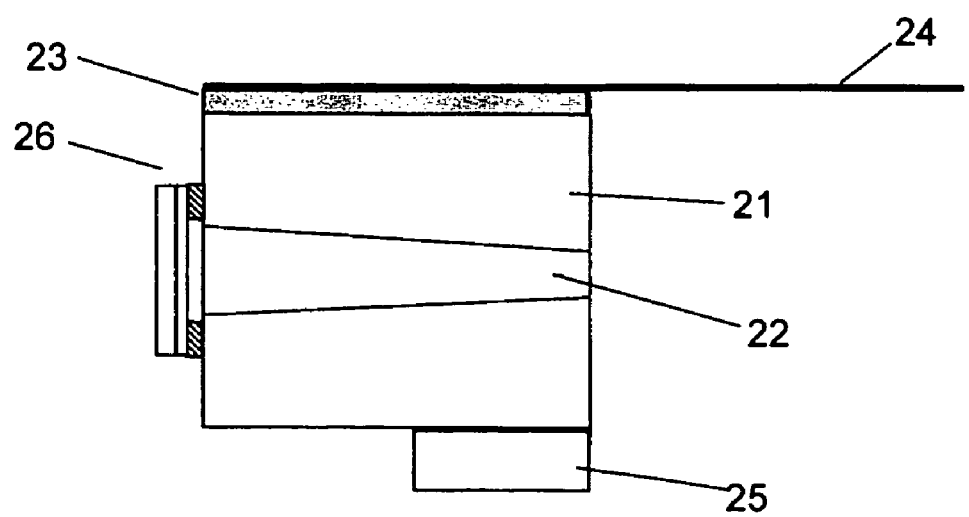
FIG. 2 is a sectional view of the vicinity of a ventilation hole illustrating an example in which the ventilation hole, which is another embodiment of the present invention, forms a tapered shape.

FIG. 2 is a sectional view of the vicinity of the ventilation hole illustrating another embodiment of the present invention. A ventilation hole 22 is expanded in a tapered shape from the inner face side toward the outer face side of the pellicle frame. Therefore, when the inside of the ventilation hole is visually observed after the pellicle frame is washed, a foreign substance inspection can be easily conducted to the depth of the ventilation hole, which improves workability, and moreover, inspection accuracy is drastically improved.

As shown in FIG. 2, a pellicle film 24 is stretched over an upper end face of a pellicle frame 21 via a film adhesive layer 23 for affixing the pellicle film 24. A mask pressure-sensitive adhesive layer 25 for attaching to a photomask is usually formed on a lower end face of the pellicle frame 21. A filter 26 for preventing particles from entering into the inside of the pellicle is attached to the ventilation hole 22.

At this time, the surface roughness inside the ventilation hole is preferably Ra1 μm or less, or more preferably Ra0.5 μm or less. Finishing is obtained by reaming after drilling and moreover, by polishing using a grinding wheel, chemical polishing using chemicals or electrolytic polishing as necessary.

Since the inner wall of the ventilation hole is smoothed, washing performance is drastically improved, and a risk that a foreign substance remains inside the ventilation hole even after washing is lowered. Also, since the surface is smooth, detection of a foreign substance is facilitated in a foreign substance inspection. Moreover, in a manufacture process, a possibility of adhesion of a foreign substance is reduced.

From the viewpoint of improvement in inspection performance, there can be a solution to enlarge a ventilation hole diameter. However, even if the diameter is enlarged, since there is no face opposing the direction of visual check, its effect is much poorer than the tapered shape. Also, the more the diameter is enlarged, the better the inspection performance becomes, but there is disadvantage that the more the diameter is enlarged, the lower the frame rigidity becomes.

A higher effect can be obtained by combining the above-mentioned means of the present invention.

In addition to the chamfering of the ventilation-hole peripheral edge portion shown in FIG. 1, finishing of the ventilation-hole inner wall to Ra1 μm or less or finishing of the inner wall of the tapered-shaped ventilation hole shown in FIG. 2 to Ra1 μm or less is a preferable case. A taper angle is not limited but an apex angle can be approximately 5°.

Figure 3:
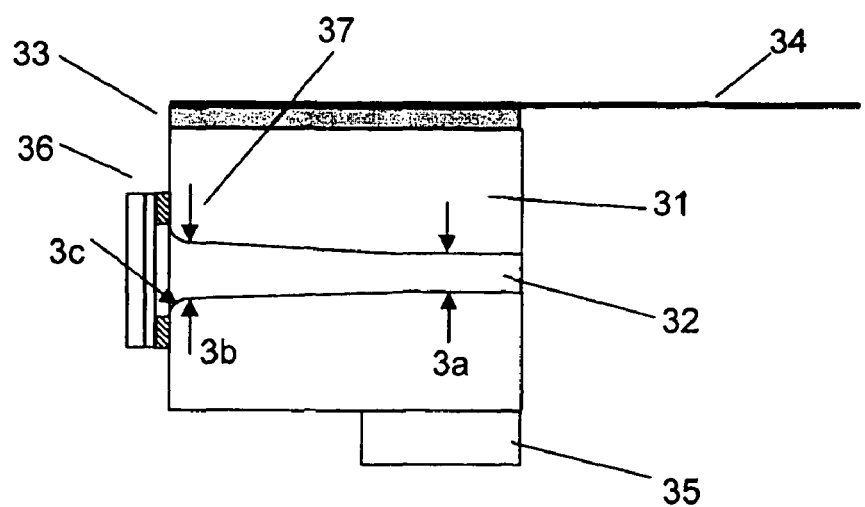
FIG. 3 is a sectional view of the periphery of the ventilation hole illustrating an embodiment in which a ventilation hole having a partial tapered shape and chamfering of the peripheral edge portion are combined.

FIG. 3 is a sectional view of the vicinity of a ventilation hole illustrating an embodiment in which chamfering of a peripheral edge portion is combined with a partially tapered ventilation hole.

In this case, an effect of the above-mentioned two examples combined can be obtained. A part of a ventilation hole 32 is in a tapered shape, and also its peripheral edge portion 37 is chamfered in a bell-like fashion. Thus, a foreign-substance inspection from the outer face side is easy, and the inspection accuracy is high. Also, since there is no sharp portion in the vicinity of the ventilation film of a filter 36 due to the bell-like chamfering of a peripheral edge portion 37, a risk of dust generation is drastically lowered.

In this example, the ventilation hole is not entirely tapered as in FIG. 2 but a part of the vicinity of the frame inside is made with a usual same hole diameter. From the viewpoint of working means, the shape can be as the above as needed, and there is no difference in effect between the both.

Particularly preferably, in the configuration of FIG. 3, the surface roughness of the ventilation-hole inner wall is further made as Ra1 μm or less. This makes a pellicle extremely favorable in all the points of dust-generation prevention from the peripheral edge portion 37 and the filter 36 of the ventilation hole, washing performance of the ventilation hole, and ease of inspection.

As shown in FIG. 3, a pellicle film 34 is stretched over an upper end face of a pellicle frame 31 via a film adhesive layer 33 for affixing the pellicle film 34. A mask pressure-sensitive adhesive layer 35 for attaching to a photomask is usually formed on a lower end face of the pellicle frame 31. A filter 36 for preventing particles from entering into the inside of the pellicle is attached to the ventilation hole 32.

Here, if a pressure-sensitive adhesive substance having permanent stickiness is applied or infiltrated to the filter 36, a pellicle without any possibility of dust generation during use can be obtained. In general, a filter is not manufactured in a clean room environment, and even if the environment is a clean room, adhesion of a foreign substance cannot be fully prevented till a product is completed through several stages of punching. Therefore, there is a fear that an adhering foreign substance might drop during ventilation, but application or infiltration of the pressure-sensitive adhesive substance having permanent stickiness fully fixes the adhering foreign substance to the filter surface.

Here, as the pressure-sensitive adhesive substance having permanent stickiness, a silicone adhesive, acrylic adhesive and the like are preferably used. Those obtained by diluting them by a solvent to several % are applied by a precise dispenser or the like in an appropriate amount. Concentration of the solution or an amount of infiltration is preferably determined as appropriate in a range that ventilation performance of the filter can be ensured.

EXAMPLES

The present invention is further described by the following, non limiting examples.

Figure 5:
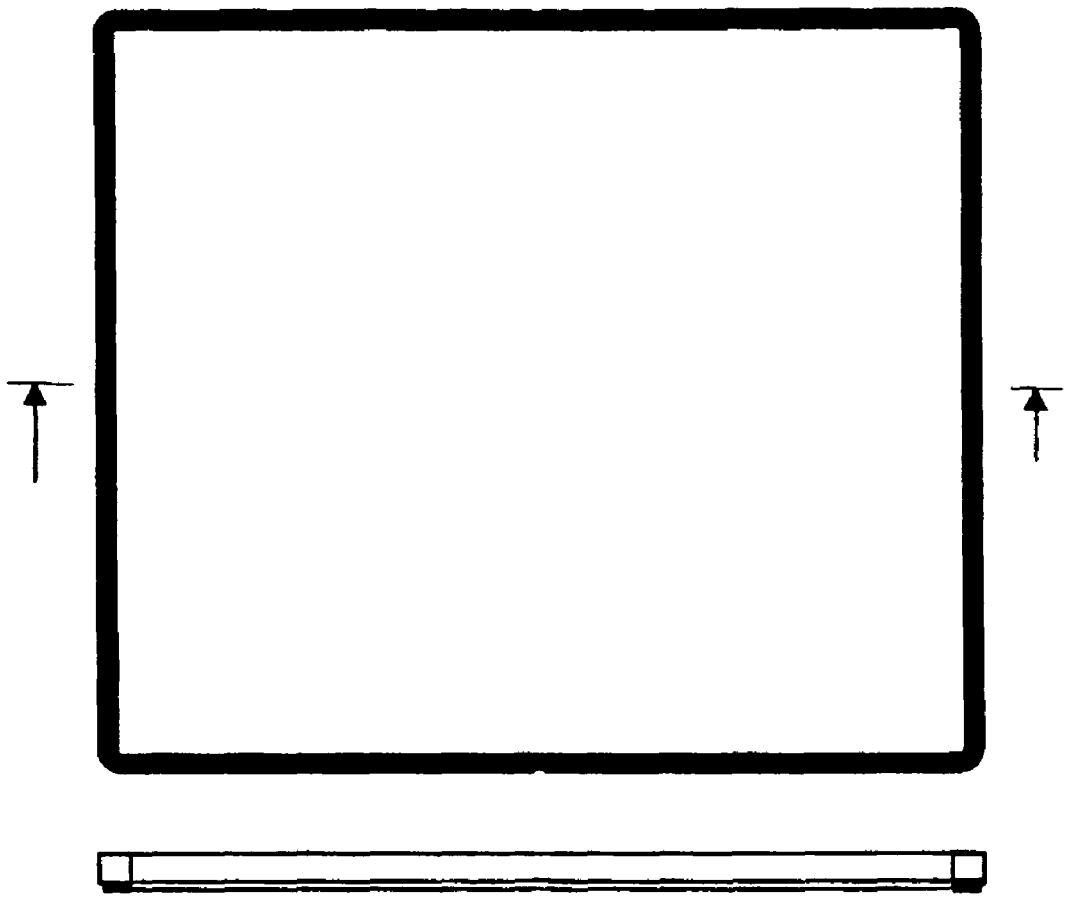
FIG. 5 is an appearance outline diagram of a pellicle.

From a rolled plate made of A5052 aluminum alloy, a pellicle frame with an outer dimension of 1526×1748 mm, an inner dimension of 1493×1711 mm, and a height of 6.2 mm and a shape as shown in FIG. 5 was manufactured by machine work. In this frame, 16 ventilation holes were disposed so that each ventilation hole had a sectional shape as shown in FIG. 3. Here, the dimensions in the figure are $3a$=1.5 mm, $3b$=2.2 mm, and $3c$ (radius of curvature)=0.5 mm. Also, an inner wall of this ventilation hole 32 was polished and worked to Ra0.5 μm. Then, after the machine work was finished, the frame surface was sandblast-treated, and further applied with black anodization treatment.

This frame was washed in a clean room of Class 10 and dried, and a foreign-substance inspection was conducted in a dark room. It is needless to say that a foreign-substance inspection was conducted also for the inside of the ventilation hole, and observation from outside the frame could check the inside well, and there was no remaining foreign substance.

To this frame, a pressure-sensitive silicone adhesive (product name: KR3700 by Shin-Etsu Chemical Co., Ltd.) diluted by toluene to form a pellicle film adhesive layer 33 was applied on an upper end face so as to have a dry film thickness of approximately 100 μm. Also, on the other end face, a pressure-sensitive silicone adhesive (product name: KR3700 by Shin-Etsu Chemical Co., Ltd.) diluted by toluene to form a mask pressure-sensitive adhesive layer 35 was applied so as to have a 6 mm width. At this time, finishing was made so that a height of the pressure-sensitive adhesive layer was approximately 2 mm.

Then, to each ventilation hole, a filter made of PTFE manufactured by punching and having a structure as shown in FIG. 4 was attached using tweezers and then, a pressure-sensitive silicone adhesive (product name: KR3700 by Shin-Etsu Chemical Co., Ltd.) diluted by toluene was applied to the surface of the filter 36 with a hand dispenser, and the filter was infiltrated with the pressure-sensitive adhesive.

After that, this frame was heated to 130° C. so as to dry the adhesive and the solvent in the adhesive and the pressure-sensitive silicone adhesive was entirely cured and then, a separator separately manufactured for protection of the pressure-sensitive adhesive was attached onto the mask pressure-sensitive adhesive layer. This separator was manufactured by cutting a PET film (thickness: 125 μm, translucent) having one face coated with a mold separator into a frame shape.

Subsequently, manufacture of the pellicle film will be described. In the above clean room, a quartz substrate of 1620×1780 mm having the surface polished smoothly was washed and dried, and then, a fluorine contained resin (product name: Cytop, by Asahi Glass Co., Ltd.) was applied as a film material to its one face using a die-coating method so as to have a film thickness of 6 μm after drying. As the film forming method, the die-coating method was used here, but various methods including a spin coating method, slit-and-spin method and the like can be used other than that. After that, a film formed substrate was heated in an oven to 200° C. so as to dry the solvent. Then, after cooling, a frame-shaped film peeling jig was bonded to this film so as to peel it off the substrate slowly and a peeled film was obtained.

Lastly, this peeled film was attached to the above-mentioned film adhesive layer of the frame, and the pellicle was brought to completion by cutting off an outside excess film by a cutter. A dust generation evaluation when the filter was air-blown was made for the completed pellicle.

First, a quartz glass substrate with 1620×1780×thickness 10 mm and having the surface polished was prepared, washed and dried in the clean room and then, a foreign-substance inspection on the substrate was conducted using a light collecting lamp in a dark room. The adhering foreign substance was removed by air blow but those that could not be removed were accurately recorded on a map regarding their positions.

Figure 7:
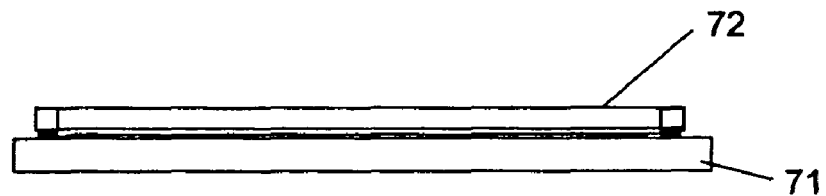
FIG. 7 is an outline diagram for explaining a method of evaluating dust generation from the filter.

After that, as shown in FIG. 7, a manufactured pellicle 72 was attached to this quartz glass substrate 71, and a closed space surrounded by the pellicle 72 and the glass substrate 71 was made. Then, five spots were selected at random in a filter portion (not shown) of the pellicle 72, and air was blown from the outside. Conditions of the air blow were a nozzle diameter: 2 mm, a distance: 20 mm, a pressure: approximately 392 kPa (4 kgf/cm$^2$), and a blow time: 10 sec.

Then, after the air blow to the filter, foreign substances on the quartz glass substrate 71 were visually inspected by a light collecting lamp in the dark room and compared with the map in the inspection before the air blow. As a result, foreign substances were not increased at all.

Comparative Example

Figure 6:
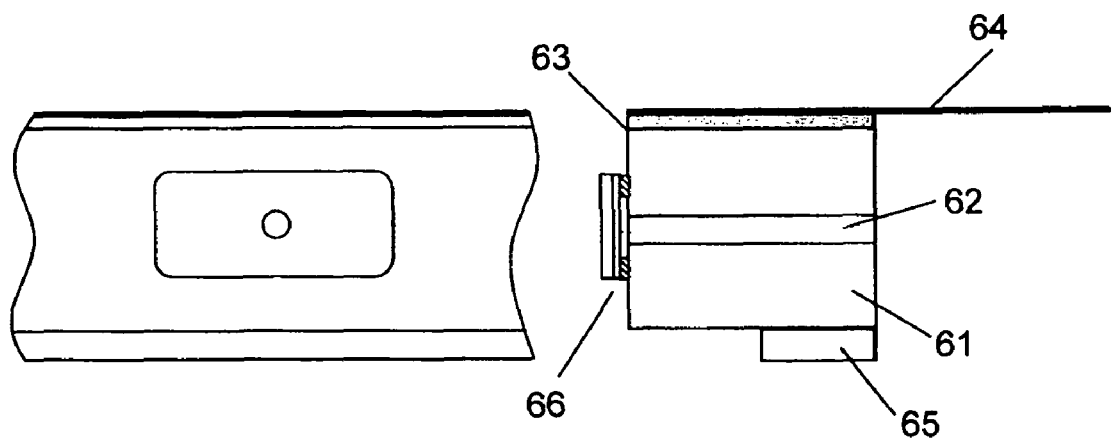
FIG. 6 is an outline diagram of the vicinity of a ventilation hole according to a prior art reference.

A pellicle frame with an outer dimension of 1526×1748 mm, an inner dimension of 1493×1711 mm, and a height of 6.2 mm as shown in FIG. 5 was manufactured by machine work from a rolled plate of A5052 aluminum alloy. In this frame, 16 ventilation holes 62 having the same diameter sectional shape and a diameter of 1.5 mm as shown in FIG. 6 were disposed. After the machine work was finished, the frame surface was sandblast treated and further applied with black anodization treatment. Measurement of the surface roughness of the inner wall in the ventilation hole 62 turned out to be Ra2 to 4 μm.

Then, similarly to the above, this frame 61 was washed and dried in a clean room of Class 10, and adhesion of foreign substances was checked in the dark room. At this time, the foreign-substance inspection was also conducted for the inside of the ventilation hole, but the ventilation hole was so narrow and deep that the state of the ventilation-hole inside could not be checked well.

After that, a film adhesive 63 and a mask pressure-sensitive adhesive 65 were applied to the frame 61 similarly to the above embodiment and a pellicle film 64 was disposed on the film adhesive 63. Moreover, a filter 66, which is in the shape as shown in FIG. 4, was attached to the ventilation holes 62 by tweezers. Then, this frame 61 was heated to 130° C. so as to dry the solvent, and the pressure-sensitive silicone adhesive was entirely cured and a separator separately manufactured for protection of the pressure-sensitive adhesive was attached onto the mask pressure-sensitive adhesive layer.

Lastly, the pellicle film manufactured similarly to the above embodiment was bonded to the film adhesive layer of this frame, and the pellicle was brought to completion by cutting off the excess film outside the frame by a cutter.

As evaluation of this pellicle, similarly to the above embodiment as shown in FIG. 7, air was blown from the outside to a filter portion of the pellicle 72 attached to the glass substrate 71 and presence of dust generation was evaluated. As a result, at two out of five spots on the glass substrate in the vicinity of the ventilation hole, adhesion of several foreign substances with diameters of 10 to 20 μm was found.

The invention claimed is:

1. A pellicle comprising:

a rectangular pellicle frame including four side bars, at least one side bar having a ventilation hole with two side openings for adjusting a pressure inside a space defined by the pellicle frame equal to an atmospheric pressure; and a filter disposed to cover an external opening of the ventilation hole for preventing entrance of a foreign substance into said space, wherein at least an edge around one of said side openings of the ventilation hole is chamfered to a degree selected from a group consisting of C0.5 to C1.0 and R0.5 to R1.0, where C0.5 means that an edge intersected by two planes at a right angle is chamfered by an inclined surface from a position 0.5 mm inward from the edge in one plane and a position 0.5 mm inward in another plane from the edge and C1.0 means that the edge is chamfered by the inclined surface from positions 1.0 mm inward from the edge at the two planes, respectively; and R0.5 means that an edge intersected by two planes at a right angle is rounded by 0.5 mm radius and R1.0 means that the edge is rounded by 1.0 mm radius.

2. A pellicle according to claim 1, wherein the filter is coated or infiltrated with a pressure-sensitive adhesive substance.

3. A pellicle according to claim 1, further comprising a film adhesive layer disposed on an upper end face of the pellicle frame to affix a pellicle film thereon, and a mask pressure-sensitive adhesive layer disposed on a lower end face of the pellicle frame and extending from an inside of the pellicle frame toward an outside of the pellicle frame so as to attach to a photomask thereon, wherein the film adhesive layer has a width same as that the pellicle frame, and the mask pressure-sensitive adhesive layer has a width shorter than that of the pellicle frame.

4. A pellicle comprising:

a rectangular pellicle frame including four side bars, at least one side bar having a ventilation hole with two side openings for adjusting a pressure inside a space defined within the pellicle frame equal to an atmospheric pressure; and a filter disposed to cover an external opening of the ventilation hole for preventing entrance of a foreign substance into said space, wherein the ventilation hole is tapered to expand from an inside to an outside of the frame.

5. A pellicle according to claim 4, wherein the filter is coated or infiltrated with a pressure-sensitive adhesive substance.

6. A pellicle according to claim 4, wherein the filter is pasted on an outer face of said at least one frame bar.

7. A pellicle according to claim 4, wherein the ventilation hole has an apex angle of approximately 5 degrees.

8. A pellicle comprising:

a pellicle frame having a ventilation hole disposed therein for adjusting an atmospheric pressure inside the pellicle equal to that outside the pellicle; and a filter attached to the ventilation hole for preventing entrance of a foreign substance into an inside of the pellicle, wherein a surface roughness of an inner wall of the ventilation hole is Ra1 μm or less.

9. A pellicle according to claim 8, wherein the filter is coated or infiltrated with a pressure-sensitive adhesive substance.

10. A pellicle according to claim 8, wherein the filter is attached to an outer face of said pellicle frame to cover the ventilation hole.

* * * * *